United States Patent
Gardner (10) Patent No.: US 8,917,502 B1
(45) Date of Patent: Dec. 23, 2014

(54) MODULAR DATACENTER

(75) Inventor: Brock R. Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 308 days.

(21) Appl. No.: 13/598,497

(22) Filed: Aug. 29, 2012

(51) Int. Cl.
*H05K 7/20* (2006.01)

(52) U.S. Cl.
USPC .............. 361/679.46; 361/679.49; 361/679.5; 361/690; 361/694; 361/695; 454/184

(58) Field of Classification Search
None
See application file for complete search history.

(56) References Cited

U.S. PATENT DOCUMENTS

| | | | |
|---|---|---|---|
| 7,961,463 B2 * | 6/2011 | Belady et al. | 361/695 |
| 8,051,672 B2 * | 11/2011 | Mallia et al. | 62/259.2 |
| 8,203,837 B2 * | 6/2012 | Zeighami et al. | 361/679.46 |
| 8,203,841 B2 * | 6/2012 | Chang et al. | 361/696 |
| 8,477,489 B2 * | 7/2013 | Lin | 361/679.46 |
| 8,490,709 B2 * | 7/2013 | Prieur | 169/46 |
| 8,763,414 B2 * | 7/2014 | Carlson et al. | 62/259.2 |
| 2013/0120931 A1 * | 5/2013 | Sankar et al. | 361/679.48 |

OTHER PUBLICATIONS

Data Center Knowledge; Wild New Design: Data Center in a Silo [online], Dec. 2009 [retrieved on Apr. 30, 2012]; 8 pgs. Retrieved from the DataCenterKnowledge:<URL: (http://datacenterknowledge.com).

* cited by examiner

*Primary Examiner* — Boris Chervinsky
(74) *Attorney, Agent, or Firm* — Kilpatrick Townsend & Stockton LLP

(57) ABSTRACT

A modular datacenter having multiple levels. The levels are stackable, and the number of levels can be selected based upon a desired installation. The datacenter includes walls or other structures that define ducts that extend through all the levels. The ducts can be used as hot and cold aisles for servers and networking equipment. The ducts can be formed by concentric cylinders.

24 Claims, 8 Drawing Sheets

MODULAR DATACENTER

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a large part of the cost of operating a datacenter is related to the datacenter's cooling systems and the total electricity cost. To this end, enterprises typically try to maximize power usage effectiveness (PUE) of a datacenter, which is a measure of how efficiently a computer datacenter uses its power; specifically, how much of the power is actually used by the computing equipment in contrast to cooling and other overhead.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to a modular datacenter that can be prefabricated and shipped to a location for quick assembly. The datacenter includes separate floors, or layers, having a data room, a mechanical and electrical compartment, and a lift shaft. The mechanical and electrical compartment and the lift shaft can be shipped to an installation location, for example on a plane, a railroad car, or a flatbed truck. The data room may be shipped in a similar manner as a single piece or in sections. When the components of the datacenter are at a location, the layers can be stacked to provide a tower structure. The number of layers or floors can be varied by an enterprise in accordance with the datacenter needs and/or limitations provided by the installation location.

The modular datacenter can be mounted as a separate, standalone structure, or it can be mounted within or on top of an existing building. A plurality of the modular datacenters could be installed within a single building or on top of a single building.

In embodiments, the modular datacenter is shaped like, and can be derived from, parts for commercially available grain silos. To this end, some of the structure could be components that are largely available and used in agribusiness to store grain. Embodiments herein utilize a cylindrical tower silo shape, although other shapes could be used.

In embodiments, the modular datacenter includes internal walls or other structures that form separations between one or more hot and cold zones, or aisles. The cold zone or zones are used for cooling of the tower structure and for access by workers or administrators. The hot zone or zones receive heat from servers and networking hardware within the modular datacenter. This heat is exhausted out of the modular datacenter by fans and natural convection currents that occur due to the advantageous structure of the modular datacenter.

In embodiments, computing devices are arranged so that they draw air from a cold zone and exhaust air into a hot zone. For example, servers are mounted in the modular datacenter so that a front portion, including intake vents for cooling, faces and is exposed to a cold zone of the modular datacenter. A rear portion, including an exhaust fan, faces a hot zone of the modular datacenter. In this manner, the server is cooled by drawing cold air from the cold zone and hot air is exhausted into the hot zone. The servers may be mounted so that they extend through a wall that separates a cold zone and a hot zone.

In a similar manner, networking hardware can be mounted so that air intake is exposed to the cold zone, with exhaust fans exposed to a hot zone. Because typical networking hardware includes exhaust on a side, the side is exposed to the hot zone.

In one example, each floor or level of the modular datacenter includes an outer wall; a secondary, inner wall; and an air gap in-between the outer and secondary wall. An interior wall is mounted inside the secondary wall and encircles a zone within the datacenter. In this embodiment, the encircled zone of the interior wall is a hot zone, with the area between the interior wall and the secondary wall being a cold zone, and the air gap between the secondary wall and the outer wall serving as a second hot zone. In an embodiment, each of these walls is a cylinder, and the three cylinders are concentric. As used herein, a "cylinder" is a continuous structure, such as a wall, that encloses a space. In embodiments herein, the cylinders are aligned vertically so as to form vertical ducts. The cylinders of the multiple layers of the modular datacenter are aligned when the layers of the datacenter are stacked. In this manner, the hot and cold zones are elongate ducts that extend the height of the tower.

In this example, the servers can be mounted on or in the secondary wall, with a front (intake vents) of the servers exposed to the cold zone and a rear (fan and/or exhaust vents) of the servers exposed to the air gap (the second hot zone, or hot zone 2). Similarly, networking hardware may be mounted against or on the interior wall such that a side of the rack is adjacent the interior wall, with the intake fans drawing air from the cold zone, and the fans and exhaust vents for the networking hardware being exposed to and blowing hot exhaust into the innermost hot zone (hot zone 1).

In operation, the cooling fans of the networking equipment draw cool air from the cold zone and exhaust hot air into hot zone 1. Similarly, the fans for the servers draw air from the cold zone into the hot zone 2. Thus, the standard cooling structures supplied for servers and networking hardware provide air flow from the cold zone, through the equipment, and into the hot zones.

The hot air in the hot zones, via natural convection currents, flows to the top of the modular datacenter, and can be vented out of the datacenter. The cooler air in the cold zone flows to the bottom of the datacenter. The bottom of each of the cylinders is open, allowing the cool air from the cold zone to flow out of the bottom of the cold zone duct, and to flow upward into the hot zone ducts, providing some cooling effect and a convection flow current in the tower. This natural convection flow may be used to cool the datacenter. Cool air may be replenished by drawing air from outside the datacenter into the cold zone, and/or from conditioned air being supplied to the cold zone, for example from chillers. Fans may be provided to enhance or start this natural convention flow, but due to temperature differentials, after the datacenter is operating, the convectional air currents can be self-sustaining without fans.

Floors for the modular datacenter are formed partly or fully of a mesh, perforated, grate or other permeable material to provide maximum air flow vertically through the structure. The cold zone, which is the work and access area for technicians, will typically include the grate flooring. The air gap between the outer and secondary wall may or may not include floors. The mechanical and electrical compartment may be attached along one side of the modular datacenter and a grate walkway may be provided from the compartment to the cold zone for operators, technicians and administrators to have access. A door may be provided to prevent the flow of air between the cold zone and hot zone 2. Similarly, a walkway may be provided from the lift tower that is mounted adjacent the modular datacenter. This walkway may also be grate or mesh material, and a door may be provided to prevent air flow between hot zone 2 and the cold zone.

The cold zone may include a vent at a top for drawing ambient air from outside the modular datacenter, or may be sealed at the top if the modular datacenter is to operate in a hot environment. In addition or alternatively, cooled air may be provided, for example from a chilling tower, that can be introduced into the cold zone.

In accordance with embodiments, the servers are mounted, for example on racks, at an angle relative to the secondary wall. In this manner, the fans on the back of the servers direct air in a direction around the perimeter of the air gap. Multiple servers mounted in this fashion cause a cyclonic effect within the air gap, enhancing air flow upward and outward of hot zone 2.

The servers may be mounted on specially designed racks that mount into openings in the secondary wall. These opening may be formed by removing punch-out plates, or may be cut out of the secondary wall as needed. In embodiments, the racks are configured so that the servers mount in a vertical fashion, instead of the typical horizontal fashion, allowing the footprint of the servers to be narrower in width. Narrower footprints permit the servers to be staggered, permitting the servers to be angled with a shallow installation.

The servers that are mounted vertically can be mounted in specially designed racks. As an example, a rack may be configured to receive a single stack of vertically aligned servers, and may be only slightly wider than the width of a single vertical server. Alternatively, a rack may be the width of two servers, for receiving two stacks of vertically aligned servers.

In embodiments, a clip system is provided for releasing and locking a server onto the server rails in the rack. In addition, cover panels may be provided for filling in one of the server slots when a server is removed, for example, when the server is under repair. These panels prevent air flow between hot and cold zones when a server is removed from the rack.

Figure 1:
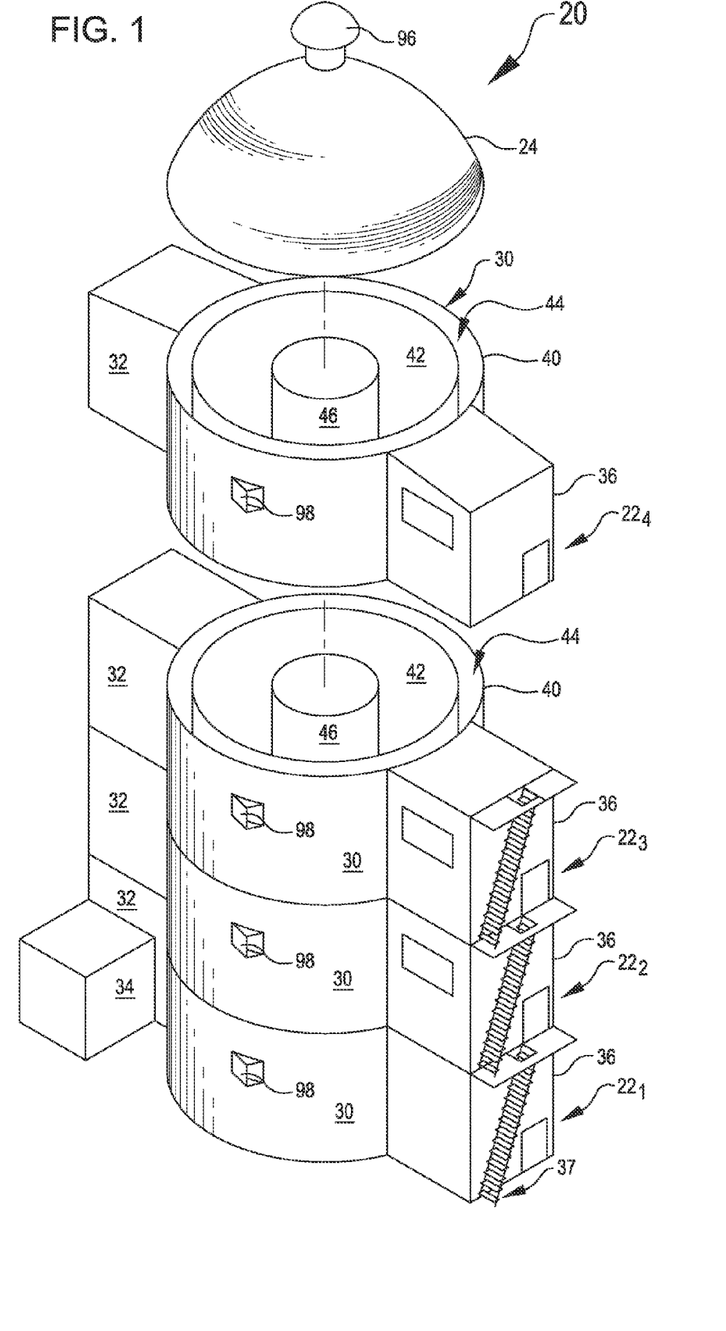
FIG. 1 shows an exploded perspective view of a modular datacenter in accordance with embodiments.

Turning now to the drawings, in which like reference numerals represent like parts throughout the several views, FIG. 1 shows an exploded perspective view of a modular datacenter 20 in accordance with embodiments. Briefly described, the modular datacenter 20 includes separate floors, or layers $22_1$, $22_2$, $22_3$, and $22_4$. A cap 24, with an upside down conical configuration, rests on top of the four separate layers 22. An enterprise may elect to install any number of layers at a site, and the layers may be configured so that they can be mostly assembled offsite, prior to installation.

Although the embodiment shown in FIG. 1 shows four layers 22, embodiments herein are structured so any number of layers may be provided, with the cap 24 mounted on the top of the uppermost layer. To this end, the modular datacenter 20 is scalable to a size that is desired for a particular installation.

Each layer 22 includes a central data room 30. A mechanical and electrical compartment 32 is mounted on one side of the data room 30, with a chiller tower 34 mounted adjacent to the mechanical and electrical compartment 32. A lift shaft 36 is mounted on the side of the data room 30 opposite the mechanical and electrical compartment 32. A fire escape 37 may be provided for the lift shaft 36. While the shown embodiment shows the mechanical and electrical compartment 32 and the lift shaft 36 mounted on opposite sides of the data room 30, these two compartments may be mounted adjacent to each other or anywhere about the perimeter of the data room. In embodiments, these two compartments are assembled offsite, shipped to an installation location, and are connected to the data room 30 during assembly.

Figure 2:
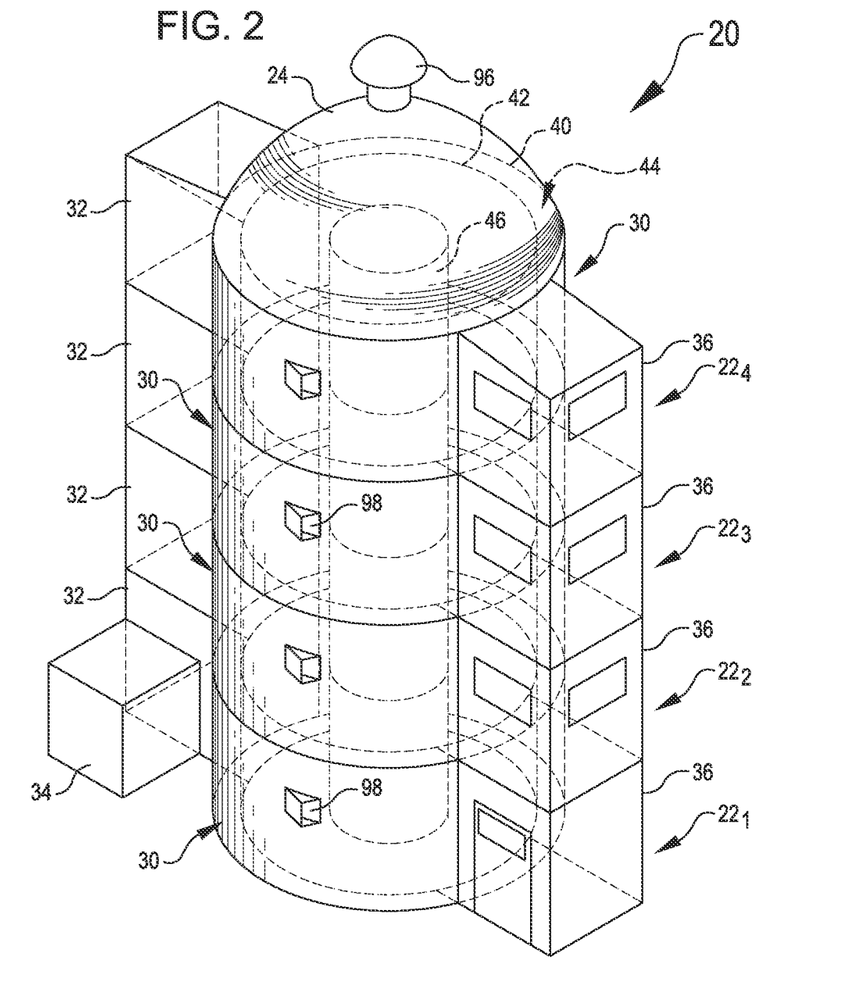
FIG. 2 shows an assembled perspective view of the modular datacenter of FIG. 1.
Figure 3:
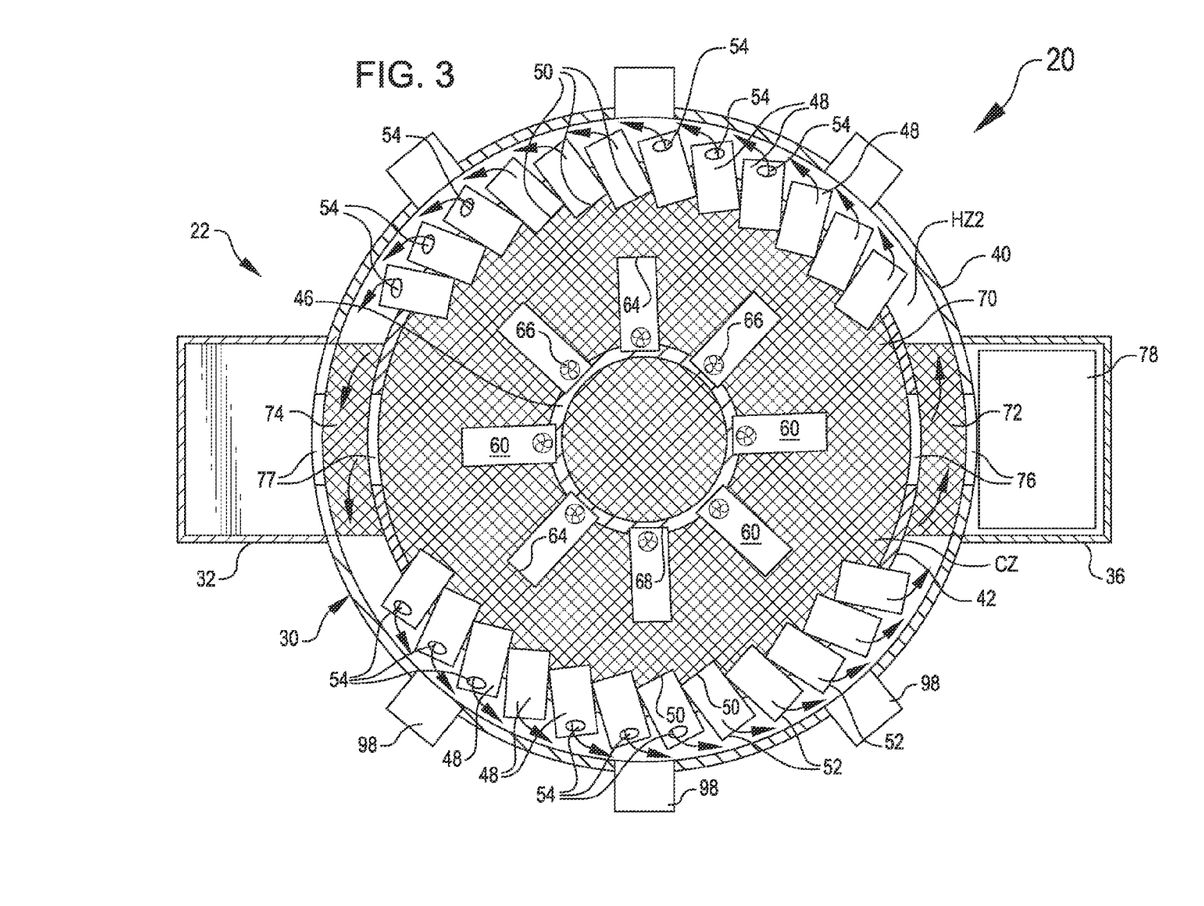
FIG. 3 shows a top view of a layer for the modular datacenter of FIG. 1.

As can be seen in FIGS. 2 and 3, in the embodiment shown in the drawing, the modular datacenter 20 includes an outer wall 40 that is exposed to an exterior environment. A secondary wall 42 is spaced inward from the outer wall 40 such that an air gap 44 is formed between the outer and secondary walls. In the embodiments shown in the drawings, the outer wall 40 forms a cylinder and the secondary wall 42 forms a smaller cylinder that fits within the cylinder, and these two cylinders are concentric. As used herein, "concentric" means that centers of the cylinders are at least somewhat close together, although not necessarily in an identical location. Thus, the air gap 44 passes along the entire perimeter of each layer 22 of the modular datacenter 20.

An interior wall 46 is spaced inward from the secondary wall 42. This interior wall 46 also forms a cylinder, and in embodiments is concentric with the outer and secondary cylinders formed by the outer and secondary walls 40, 42.

As shown in the assembled perspective view of FIG. 2, when the layers 22 are stacked on top of each other, the outer walls 40 and 42, and interior walls 46 of each of the layers stack on top of each other so as to form three elongate cylinders. As described below, these elongate cylinders form air ducts for flow of hot and cold air in the modular datacenter 22.

The first elongate cylinder, formed by the interior walls 46, is received within the second cylinder, formed by the secondary wall 42, which in turn is received within the cylinder formed by the outer wall 40. As described in more detail below, these cylinders separate hot and cold zones, or aisles, within the modular datacenter 20. In the embodiment shown in the drawings, the zone defined in the air gap 44 is a hot zone HZ2 (FIG. 4), and the zone between the interior wall 46 and the secondary wall 42 is a cold zone CZ (also FIG. 4). The area inside the cylinder formed by the interior wall 46 is a second hot zone HZ1 (FIG. 4).

Figure 4:
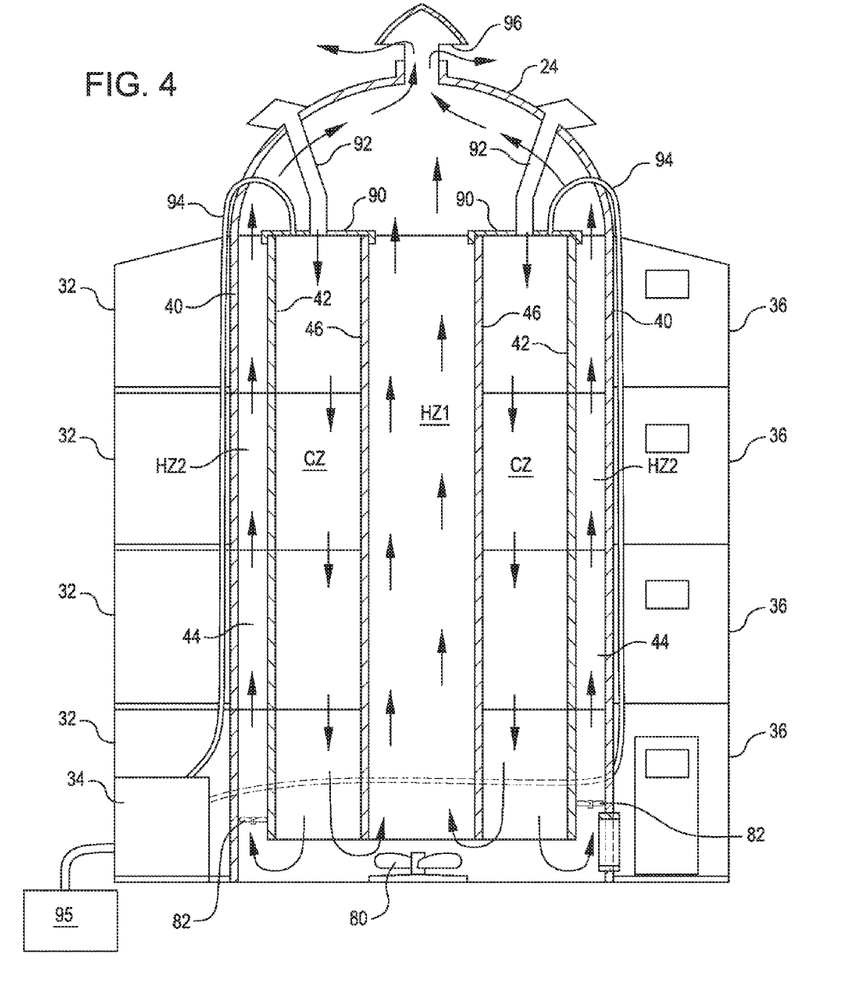
FIG. 4 shows a schematic, cutaway view of air flow for the modular datacenter of FIG. 1.

As shown in FIG. 4, the bottom of the walls 40, 44, 46 are open, to permit air flow between the cold zone and hot zones HZ2 and HZ1. Air flow is discussed in more detail below.

FIG. 3 shows a top view of one of the layers 22. As can be seen in the figure, the secondary wall 42 includes a plurality of server racks 48 mounted thereon. The server racks 48 may be, for example, mounted in openings formed by the removal of knock-out panels. The server racks 48 are mounted so that servers in the racks have a front 50 that faces the cold zone CZ. A rear 52 of the servers communicates with the hot zone HZ2. A fan 54 for the servers is positioned at the rear of the servers in a manner known in the art, and directs exhaust toward the hot zone HZ2.

Network hardware racks 60 are mounted in a spoke relation on the interior wall 46. The network hardware rack 60 includes routers and/switches for the modular datacenter 20. As is known, network hardware typically includes a large number of data ports on a front side for allowing wiring connections between multiple network devices. Vent intake for cooling is typically on one side of network devices, with a fan on the other side for drawing air through the device. In the embodiment shown in FIG. 3, the network devices are mounted so that an intake side 64 of the devices in the network hardware rack 60 faces the cold zone CZ, and exhaust fans 66 are mounted on an opposite side 68 of the network hardware rack 60. This opposite side 68 is in communication with the hot zone HZ1.

The layer 22 includes a grate floor 70. This grate floor 70 can support operators within the layer 22, but allows the passage and flow of air therethrough. In the embodiment shown in the drawing, the grate floor covers the cold zone CZ, where most workers would be. In the figure shown in FIG. 3, the grate floor 70 also covers the area inside the interior wall 46, but, in embodiments, such a floor may not be included. In addition, although flooring is not shown in the air gap 44, flooring could be provided in this area if needed for access, for example to the back of the servers 48. A grate runway 72 may be provided between the lift shaft 36 and the grate floor 70. Similarly, a grate runway 74 may be provided between the mechanical and electrical compartment 32 and the grate floor 70.

Doors 76 are provided for egress through the outer wall 40 and the secondary wall 42 from the lift shaft 36. An elevator 78 is mounted in the lift shaft 36. A user wishing to access the cold zone CZ may ride the elevator 78 to the proper layer, and then enter the cold zone through the doors 76 while walking across the grate runway 72. Similar doors 77 may be provided for accessing the mechanical and electrical compartment 32. The doors 77 and 76, once closed, prevent air flow between the hot zone HZ2 and the cold zone CZ, and from the hot zone HZ2 into the lift shaft 36 and the mechanical and electrical compartment 32. Hand rails or other safety equipment (not shown) may be provided along the runways 72, 74. In addition, although a door is not shown for entry into the hot zone HZ1, a door could be provided in the interior wall 46 for this purpose.

FIG. 4 is a cutaway schematic drawing showing air flow in the modular datacenter 20 in accordance with embodiments. As can be seen in the drawings, as shown by the air flow arrows, the general air flow for the modular datacenter 20 is hot air moving upward in the hot zones HZ1 and HZ2, and cold air moving downward in the cold zone CZ. To this end, the zones act as ducts for the convection of hot and cold air in the system. Cold air that moves downward through the bottom of the cold zone CZ may then flow upward through the hot zones HZ1 and HZ2. Optional fans 80, 82 may be provided at the bottom of the hot zones HZ1 and HZ2 for initiating or contributing to the flow of the hot air upward in the system. Similarly, fans (not shown) could be provided for directing flow in the cold zone CZ. However, in embodiments, air flow may rely entirely on natural convection currents that occur inside a cylinder and due to the difference in temperatures between the cold and hot zones in the structure.

As shown in FIG. 4, the secondary wall 42 and the interior wall 46 and the bottom layer 22 do not extend all the way to the bottom of the modular datacenter 20. In this manner, air flow is allowed between the bottoms of the cold zones and the hot zones. The opened cylinders permit convection flow within the system. The network hardware on the interior wall 86 draws air from the cold zone CZ and blows hot exhaust air into the hot zone HZ1. Servers on the server racks 48 draw air from the cold zone CZ and exhaust hot air into the hot zone HZ2. Air within the cold zone CZ may be sealed off at a top portion by a top seal 90, such as a wall. A vent 92 may be provided for drawing ambient air into the cold zone CZ. This vent 92 may not be needed when the modular datacenter 20 is operated, for example, in a hot environment. However, ambient air may be useful in installments where the air outside is cool enough to provide a cooling function for the modular datacenter 20. If desired, a closure may be provided for selectively closing the vent. A conduit 94 may connect the cold zone to the chiller towers 34, providing chilled air for the cold zone CZ. This conduit 94 may flow to the top of the cold zone CZ, as shown in FIG. 4, or may be directed to the bottom of the modular datacenter 20 so that the chilled air mixes with air in the system. A generator 95 may be provided for powering the chiller towers 34.

In embodiments, as shown in FIG. 3, the server racks 48 are mounted at an angle. In this manner, air flow out of the back of servers in the server racks is directed along the air gap 44. Directing air in this manner causes a cyclonic effect within the hot zone HZ2, because air is directed both sideways, by the fans in the servers, and upwards, due to convection. The cyclonic effect enhances convection air flow, and contributes to natural convection of the system. Moreover, the cyclonic effect is provided without modification of the hardware for the servers. Although the cyclonic air flow may be provided by mounting the servers at an angle, louvers or other structures could be used to direct air exiting the servers. Moreover, although the server racks 48 are shown mounted at an angle, other computing equipment, including the network hardware, could be mounted at an angle to provide directed exhaust of heat. Further, network hardware may be mounted in the wall 42, and/or servers in the wall 46, and/or separate floors 22 may have different computing equipment, such as an entire floor of networking hardware sandwiched between floors of just servers. In such an arrangement, the networking hardware floor may include network hardware on one or both of the walls 42, 46, and the server floors may similarly include servers in one or both of the walls.

The cap 24 includes a vent 96 at its top, permitting the flow of hot air out of the modular datacenter 20. In addition, if desired, side vents 98 (FIGS. 3 and 1) are provided on the side for allowing the venting of hot gasses along the sides of the modular data tower. As shown in FIG. 1, these side vents 98 may open out one side, so that they match the air direction provided by the cyclonic air effect.

Figure 5:
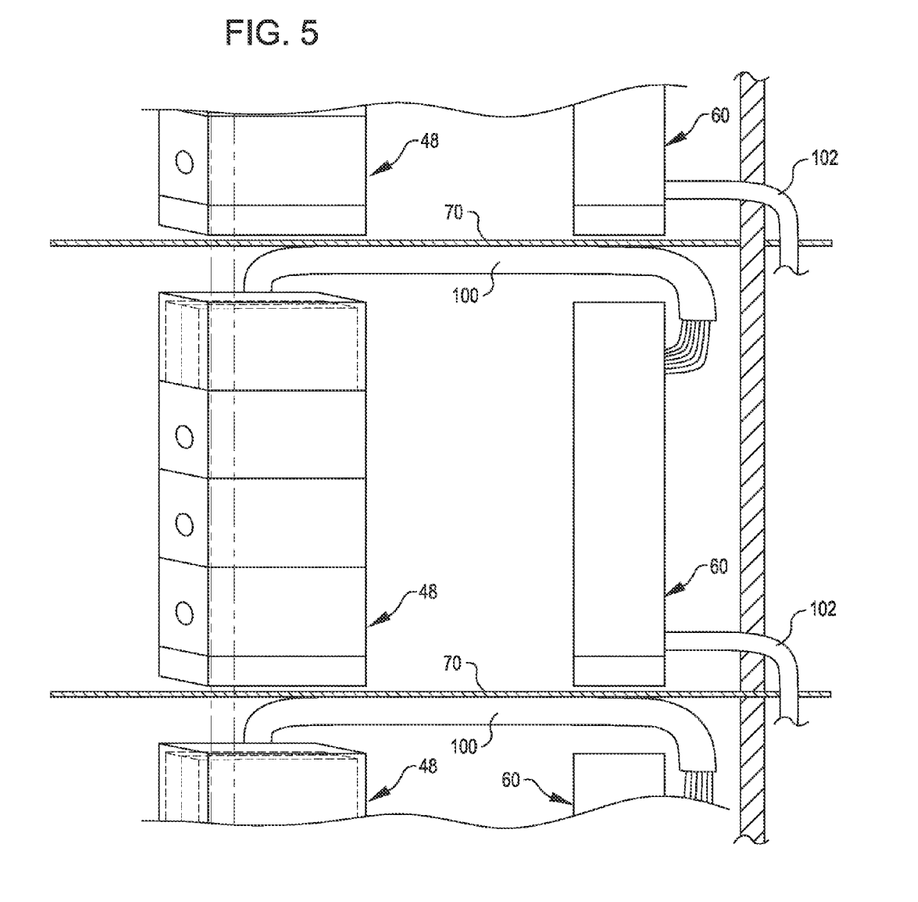
FIGS. 5 and 6 show schematic cutaway views of wire routing embodiments for the modular datacenter of FIG. 1.

Wires for the modular datacenter 20 may be routed underneath the floors 70. As shown in FIG. 5, wire conduits 100 may be provided that extend under the floors 70 and that permit wires to be extended from the server racks 48 to the network hardware racks 60. Separate conduits 102 may be provided for power. In the embodiment shown in FIG. 6, separate conduit 102 extends from the network hardware rack 60 out a bottom of the interior wall 46. However, in alternate embodiments, the power conduit may extend under the floor. A similar conduit may be provided for power for the network hardware rack 60. The power conduits typically are routed to the mechanical and electrical compartment 32 and provided appropriate power from electrical sources in that compartment.

Figure 6:
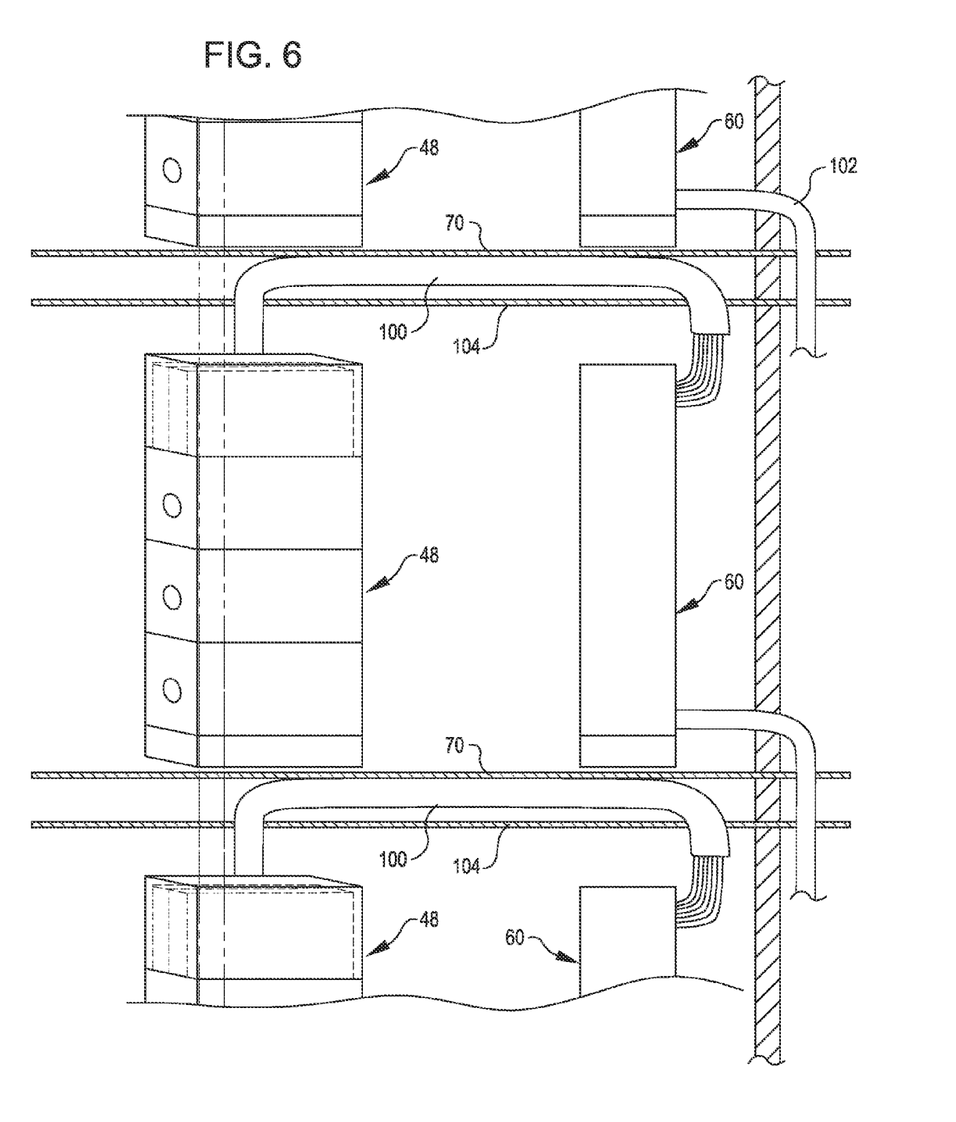

As an alternative, as shown in FIG. 6, a grate ceiling 104 may be provided for each of the layers 22. If the ceiling 104 is provided, then the wiring conduits 102 may extend between the ceiling and a floor 70 on an adjacent layer 22.

Figure 7:
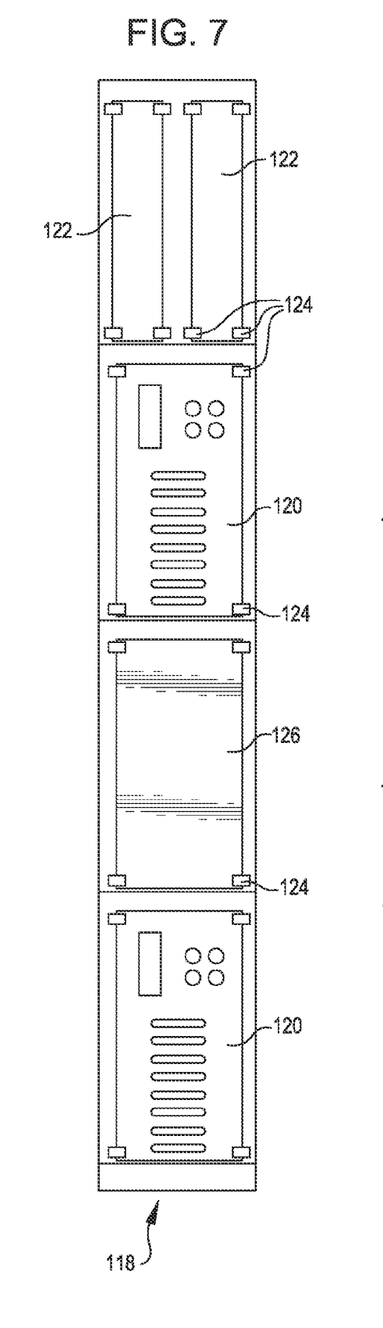
FIGS. 7 and 8 show front views of server racks that can be used with the modular datacenter of FIG. 1 in accordance with embodiments.
Figure 8:
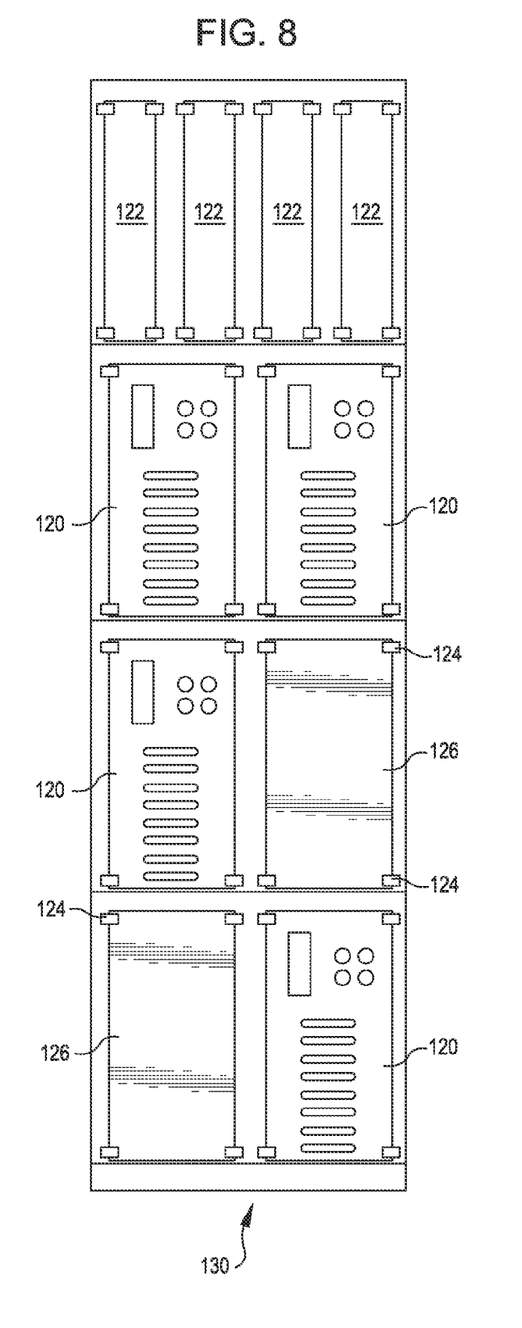
Figure 9:
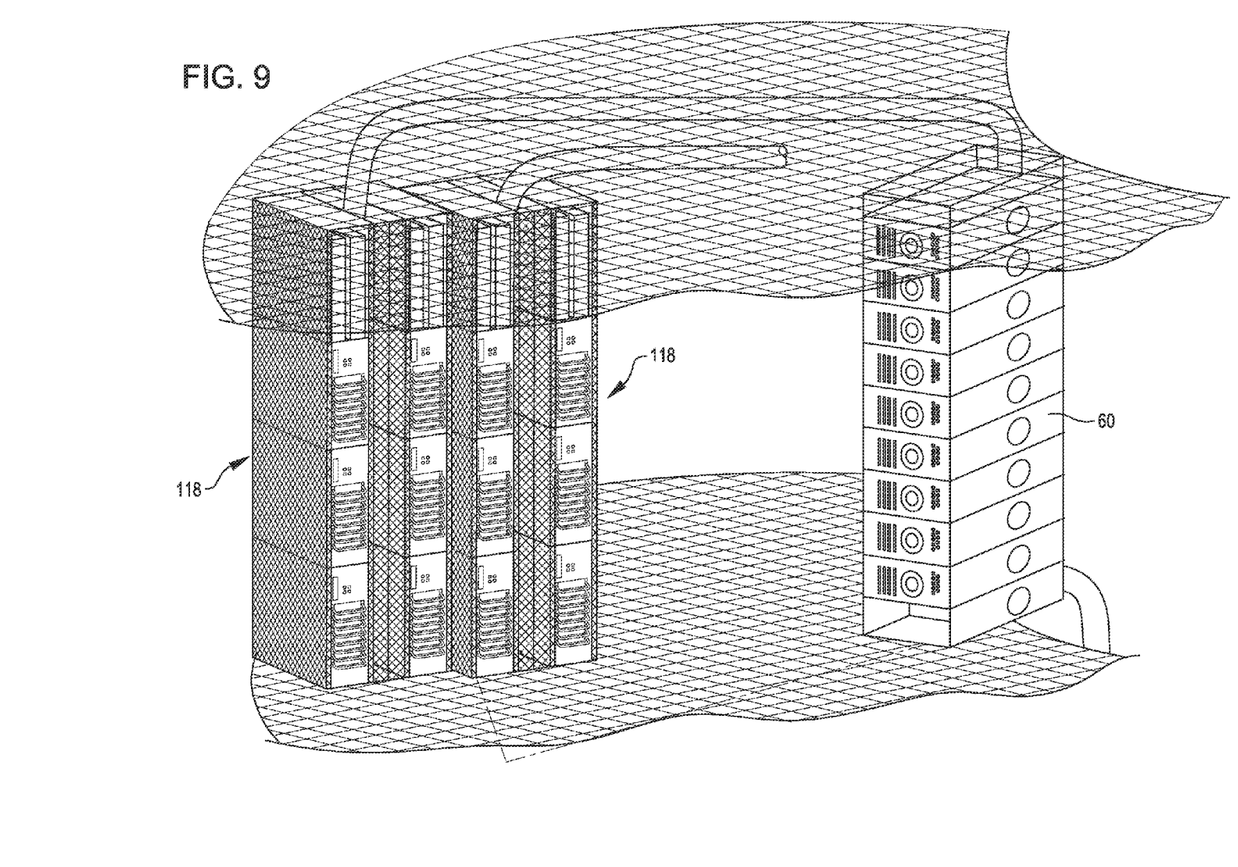
FIG. 9 shows a diagrammatic view of multiple server racks, as shown in FIG. 8, mounted in a staggered fashion.

FIGS. 7 and 8 show embodiments of server racks 118, 130 that may be used for the server rack 48 in the modular datacenter 20. Unlike conventional server racks that provide rails for mounting servers in a horizontal manner, the server racks 118, 130 provide rails for mounting a server in a vertical orientation. In this manner, the overall rack can be made narrower in width than a conventional server rack. This configuration permits the server racks 118, 130 to be mounted in a staggered fashion, side-by-side, in a more angled orientation relative to the secondary wall 42. For example, as shown in FIG. 9, if the server rack 130 is utilized, a series of server racks may be mounted in a staggered fashion to provide the angled mounting.

In embodiments, the server racks are mounted in openings that are formed by removing knock-out panels in the secondary wall 42. Thus, in installation, a technician removes the knock-out panel and mounts the server rack in the slanted configuration shown in FIG. 9. If the server rack 118 is provided, then staggering of the server racks can be done in a much closer fashion, allowing a more angled presentation of the back of the servers.

In the server racks 118, 130, servers 120 are mounted vertically in openings in the server rack in a stacked fashion. In the server rack 118, three servers are mounted one on top of the other and a pair of top-of-rack switches 122 is mounted above the servers. As is known, the top-of-rack switches 122 provide wire connections to and from the network hardware on the network hardware racks 60.

In an embodiment, plates or panels 126 are provided for selectively covering openings of the server racks 118, 130. These plates or panels 126 are removed to install a server 120. When a server 120 is removed, for example for repair, the panel 126 is mounted back over the opening so as to prevent the flow of cold and hot air between the cold zone CZ and the hot zone HZ2. Clips 124 are provided for mounting the servers 120 or panels 126 in place. Similar clips 124 and panels 126 may be used to selectively cover top-of-rack switch openings.

In the embodiment shown in the drawings, the walls 40, 42, and 46 of the modular datacenter 20 are shaped like cylinders, and the cylinders are concentric. However, the modular datacenter may be formed with hot and cold zones of many different shapes. Embodiments herein include shapes that are rounded so as to aid an air flow, especially where the cyclonic effect is used. However, utilizing a cylindrical shape permits components from typical grain silos to be used, and provides a structure where mass of the system is evenly distributed.

To install the modular datacenter, the data room 30, the mechanical and electrical compartment 32, the chiller tower 34, and the lift shaft 36 are transported to an installation location. The mechanical and electrical compartment 32, the chiller tower 34, and the lift shaft 36 may be sized so that they may fit on a conventional flat bed of a truck. In embodiments, the data room 30 may also be of a configuration and size that it may be transported on a truck. However, if the data room 30 is large, it can be broken down in sections, such as halves or quarters, so as to be of appropriate size to fit on a truck or other transport.

When all components are assembled at a site, technicians may assemble the appropriate components and remove knock-out panels and install the server racks 48 and network hardware racks 60. Wiring then may be routed and connected, and the modular datacenter 20 is ready for operation.

The modular datacenter 20 is advantageous in that its stacked configuration is easily scalable, provides a small footprint, and can utilize natural convection currents for cooling. Due to the cyclonic air mass provided by the angled servers, air flow moves into and out of the structure with little need for energy from fans once the air flow has been started. Thus, the modular datacenter 20 provides a power-efficient model with very little energy needed for cooling after operation has begun.

If desired, the modular datacenter 20 may be mounted on top of a building or inside of a building. A series of the modular datacenters 20 may be mounted inside a single building or on top of a building. Alternatively, a modular datacenter 20 may be a separate, standalone structure in a field or other installation location.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A datacenter, comprising:
   a plurality of levels stacked one on top of each other, each level comprising:
   a first cylinder forming a first duct for vertical airflow therethrough;
   a second cylinder, concentric with the first cylinder, and surrounding the first cylinder so that a second duct is formed between the first cylinder and the second cylinder, the second duct for vertical airflow therethrough;
   a third cylinder, concentric with the first cylinder, and surrounding the second cylinder so that a third duct is formed between the second cylinder and the third cylinder, the third duct for vertical airflow therethrough;
   a server farm comprising a plurality of servers, each server comprising an air intake on one side and an air exhaust on another side, the servers of the server farm being arranged on the second cylinder such that air intakes for servers on the server farm are in fluid communication with the second duct and the air exhausts for the servers is in fluid communication with the third duct; and
   a plurality of network racks, each network rack including one or more network hardware components, the network hardware components including an air intake and an air exhaust, the one or more network hardware components being arranged on the first cylinder such that air intakes for the network hardware components are in fluid communication with the second duct and the air exhausts on the network hardware components are in fluid communication with the first duct; and
   wherein the first cylinders, second cylinders, and third cylinders for each of the levels align to form continuous cylinders through the plurality of multiple levels.

2. The datacenter of claim 1, further comprising a conical cap fitting over a top level of the datacenter.

3. The datacenter of claim 2, further comprising a vent in the top of the conical cap, the vent in fluid communication with the first and third ducts.

4. The datacenter of claim 3, wherein the second duct is capped and isolated from the vent, the first duct, and the third duct.

5. The datacenter of claim 4, further comprising a vent connecting the second duct to ambient air exterior of the datacenter.

6. The datacenter of claim 1, wherein the bottoms of the first, second, and third cylinders are in fluid communication with each other.

7. A level for a datacenter, comprising:
   a first structure forming a first duct for vertical airflow therethrough;
   a second structure surrounding the first structure so that a second duct is formed between the first structure and the second structure, the second duct for vertical airflow therethrough;
   a third structure surrounding the second structure so that a third duct is formed between the second structure and the third structure, the third duct for vertical airflow therethrough;
   a plurality of openings in the second structure for receiving a plurality of first computing devices, each first computing device comprising an air intake on one side and an air exhaust on another side, the openings being configured to receive the first computing devices on the second structure such that, when the first computing devices are in position, air intakes for the first computing devices face the second duct and air exhaust faces the third duct;
   a plurality of openings in the first structure for receiving a plurality of second computing devices, each second computing device including an air intake and an air exhaust, the openings in the first structure being arranged on the first structure such that, when the second computing devices are mounted on the first structure, air intakes for the network hardware components face the second duct and air exhaust faces the first duct; and
   wherein the first duct, second duct, and third duct each forms a continuous vertical ducts through the level.

8. The level for a datacenter of claim 7, further comprising a plurality of said levels, stacked so that first, second and third ducts for the levels align to form continuous vertical ducts through the multiple levels, the multiple levels forming a datacenter, and a cap fitting over a top level of the datacenter.

9. The level for a datacenter of claim 7, wherein the first computing devices comprise servers.

10. The level for a datacenter of claim 7, wherein the second computing devices comprise network hardware components.

11. The level for a datacenter of claim 7, wherein each of the first structure, second structure and third structure is a cylindrical wall.

12. The level for a datacenter of claim 7, wherein the bottoms of the first, second, and third ducts are open so that the bottom are in fluid communication with each other.

13. A datacenter, comprising:
   a plurality of levels stacked one on top of each other, each level comprising:
   a first structure forming a first duct for vertical airflow therethrough;
   a second structure forming a second duct, the second duct for vertical airflow therethrough;
   a third structure forming a third duct for vertical airflow therethrough;
   the first, second and third ducts being isolated from each other;
   a server farm comprising a plurality of servers, each server comprising an air intake on one side and an air exhaust on another side, the servers of the server farm being arranged such that air intakes for servers on the server farm draw air from the second duct and air exhausts on the servers exhausts air into the third duct; and
   a plurality of network racks, each network rack including one or more network hardware components, the network hardware components including an air intake and an air exhaust, the one or more network hardware components being arranged such that air intakes for the network hardware components draw air from the second duct and the air exhausts on the network hardware components exhaust air into the first duct;

the first, second, and third ducts of a bottom of the layers being in fluid communication at a bottom end; and the second duct being fluidly isolated from the first and third ducts at a top end;

wherein the first ducts, second ducts, and third ducts for each of the levels align to form continuous ducts through the plurality of multiple levels; and at least one vent in fluid communication with a top of the stack of the first and third ducts for exhausting air from the ducts out of the datacenter.

14. The datacenter of claim 13, further comprising at least one fan mounted to direct air up at least one of the first and third ducts.

15. The datacenter of claim 13, further comprising a chiller in fluid communication with the second duct.

16. The datacenter of claim 13, further comprising a grate floor in the bottom of the second duct.

17. The datacenter of claim 13, further comprising a lift mounted to a side of the datacenter, the lift providing access to each of the levels.

18. The datacenter of claim 13, further comprising a mechanical and electrical compartment mounted along a side of the datacenter, and accessible from each of the levels.

19. A method of fabricating a datacenter, comprising:

assembling a plurality of levels at a site by stacking the levels one on top of the other, each of the levels comprising:

a first cylinder forming a first duct for vertical airflow therethrough;

a second cylinder, concentric with the first cylinder, and surrounding the first cylinder so that a second duct is formed between the first cylinder and the second cylinder, the second duct for vertical airflow therethrough;

a third cylinder, concentric with the first cylinder, and surrounding the second cylinder so that a third duct is formed between the second cylinder and the third cylinder, the third duct for vertical airflow therethrough;

wherein, when the levels are stacked, the first cylinders, second cylinders, and third cylinders for each of the levels align to form continuous cylinders through the plurality of multiple levels;

mounting a cap on a top of the levels;

mounting a lift on a side of the levels, the lift providing access to each of the levels;

mounting a mechanical and electrical compartment on a side of the levels, and access from each of the levels to the compartment;

mounting a plurality of server racks at at least one of the levels, the server racks comprising mounting locations for a plurality of servers, each server comprising an air intake on one side and an air exhaust on another side, the server racks being arranged such that, when servers are mounted on the server racks, air intakes for servers face the second duct and air exhaust faces the third duct; and mounting a plurality of network racks at at least one of the levels, each network rack including mounting locations for one or more network hardware components, the network hardware components including an air intake and an air exhaust, the network racks being arranged such that, when network hardware components are mounted on the server racks, air intakes for the network hardware components face the second duct and air exhaust faces the first duct.

20. The method of claim 19, further comprising mounting a vent in fluid communication with a top of the first and third cylinders and ambient atmosphere outside the datacenter.

21. The method of claim 19, further comprising capping a top of the topmost second cylinder.

22. The method of claim 21, further comprising mounting a vent between the second cylinder cap and ambient atmosphere outside the datacenter.

23. The method of claim 19, further comprising mounting at least one fan to aid in exhaust of at least one of the first and third cylinders.

24. The method of claim 19, further comprising mounting at least one chiller tower in fluid communication with the second cylinder.

* * * * *